United States Patent [19]
Fanning

[11] Patent Number: 4,521,828
[45] Date of Patent: Jun. 4, 1985

[54] COMPONENT MODULE FOR PIGGYBACK MOUNTING ON A CIRCUIT PACKAGE HAVING DUAL-IN-LINE LEADS

[75] Inventor: William J. Fanning, Glen Ellyn, Ill.

[73] Assignee: AT&T Technologies, Inc., New York, N.Y.

[21] Appl. No.: 452,662

[22] Filed: Dec. 23, 1982

[51] Int. Cl.³ ............................................. H05K 7/20
[52] U.S. Cl. .............................. 361/386; 174/52 FP; 357/70; 361/306; 361/421
[58] Field of Search ............... 361/380, 386, 389, 393, 361/395, 399, 396, 400, 404, 405, 421, 306, 274; 357/70, 72, 74, 75, 80, 81; 339/17 CF, 112, 176 MP, 220 R, 275 B; 174/52 FP, 16 HS; 165/80 B, 105; 338/323, 324, 325, 333, 334

[56] References Cited
U.S. PATENT DOCUMENTS 2,748,328  5/1956  Font et al. ......................... 317/257
3,880,493  4/1975  Lockhart, Jr. .................. 339/147 R
3,930,114 12/1975  Hodge ............................. 174/16 HS
4,249,196  2/1981  Durney et al. ................. 174/52 FP
4,398,235  8/1983  Lutz et al. ........................... 361/396

FOREIGN PATENT DOCUMENTS 0010074 1/1977 Japan .................................... 357/70

OTHER PUBLICATIONS

"Quiet Socket", which includes a leaded decoupling capacitor mounted in a recess thereof, sold by the Garry Company, North Brunswick, N.J.

Primary Examiner—A. D. Pellinen
Assistant Examiner—Gregory D. Thompson
Attorney, Agent, or Firm—K. R. Bergum; M. de Picciotto

[57] ABSTRACT

A component module (15, 70), adapted for piggyback mounting on an IC Dip (51,81), preferably incorporates a decoupling capacitor (18, 44, 74), with opposite end electrodes (23, 24), encapsulated within a molded housing (21, 72) of preferably parallelepiped configuration. The electrodes are uniquely connected to only two of preferably four rectangularly shaped terminals (26-29, 76-79) that project downwardly from different corners of the housing. The terminals, as well as an optional heat sink (61) are preferably formed out of a strip stock carrier (33). The two capacitor-connected terminals (27, 29 and 77, 79) are uniquely diagonally disposed and spaced, for a decoupling application, so as to respectively engage the battery and ground leads of a standard pin-out DIP (51, 81). The other two diagonally disposed component module terminals (26, 28 or 76, 78) are electrically isolated from the capacitor, being employed only to facilitate the mounting of the module on an associated DIP. In one component module embodiment (15, FIG. 1), the terminals (26-29) are adapted for soldered securement to a circuit board (54), whereas in a second embodiment (70, FIG. 6) the terminals (76-79) are adapted to be snap-locked on and, thereafter, soldered to, upper horizontal shoulder portion (82a) of respectively aligned leads (82) of a supporting DIP (81).

21 Claims, 10 Drawing Figures

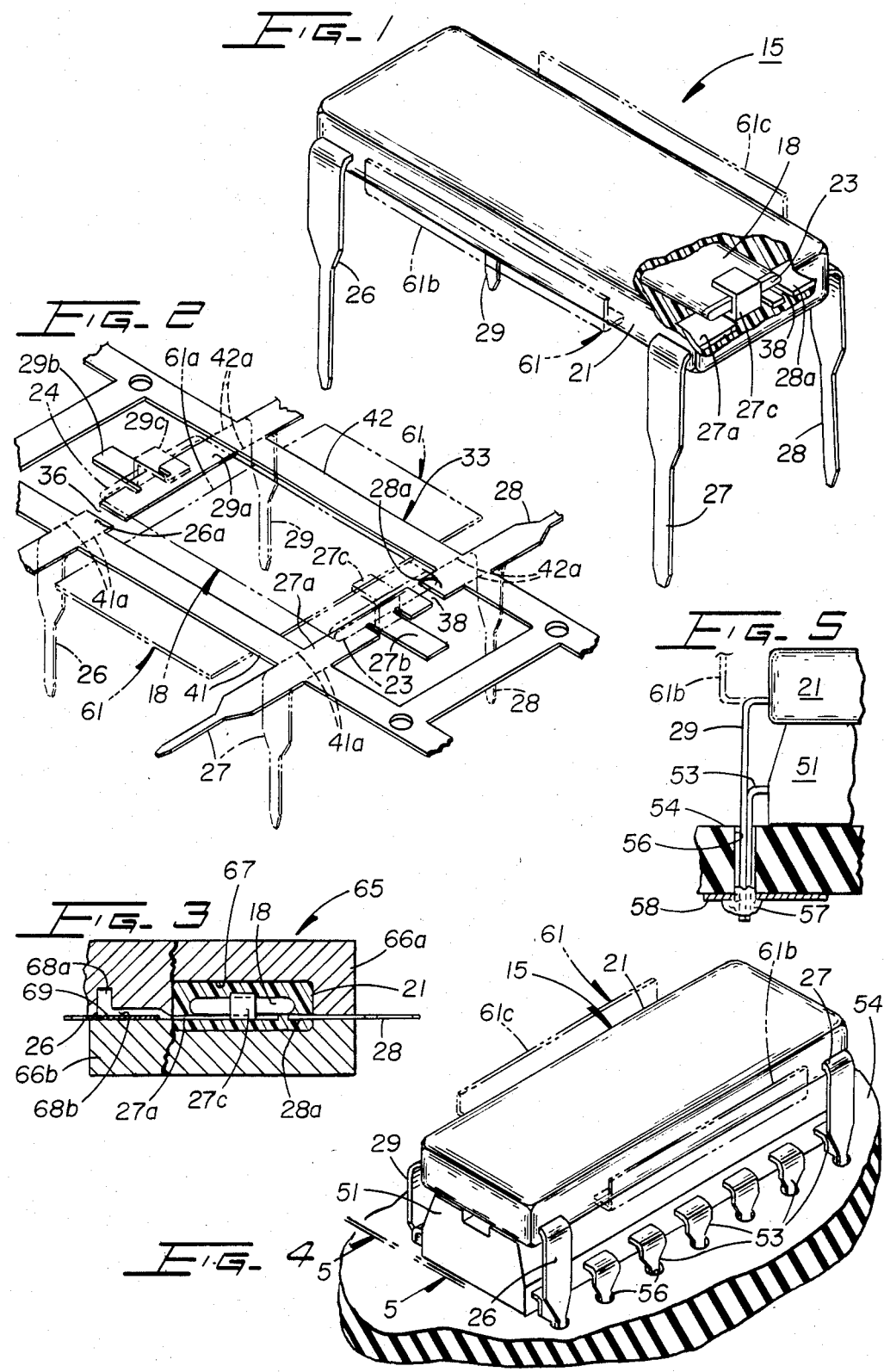

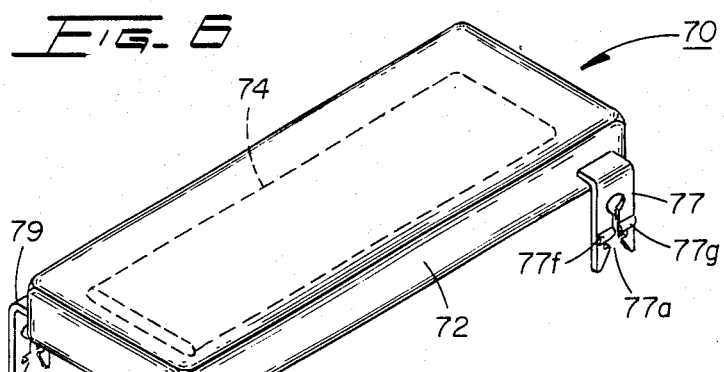
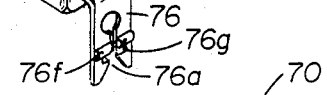
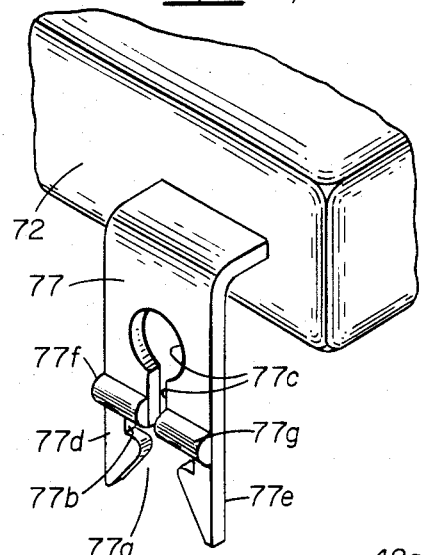
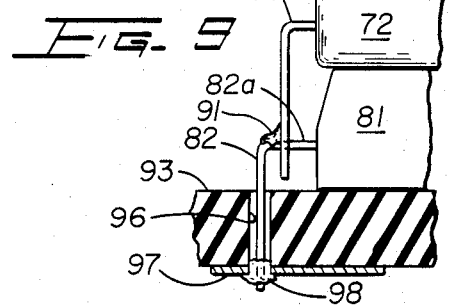
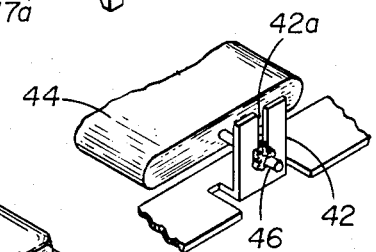
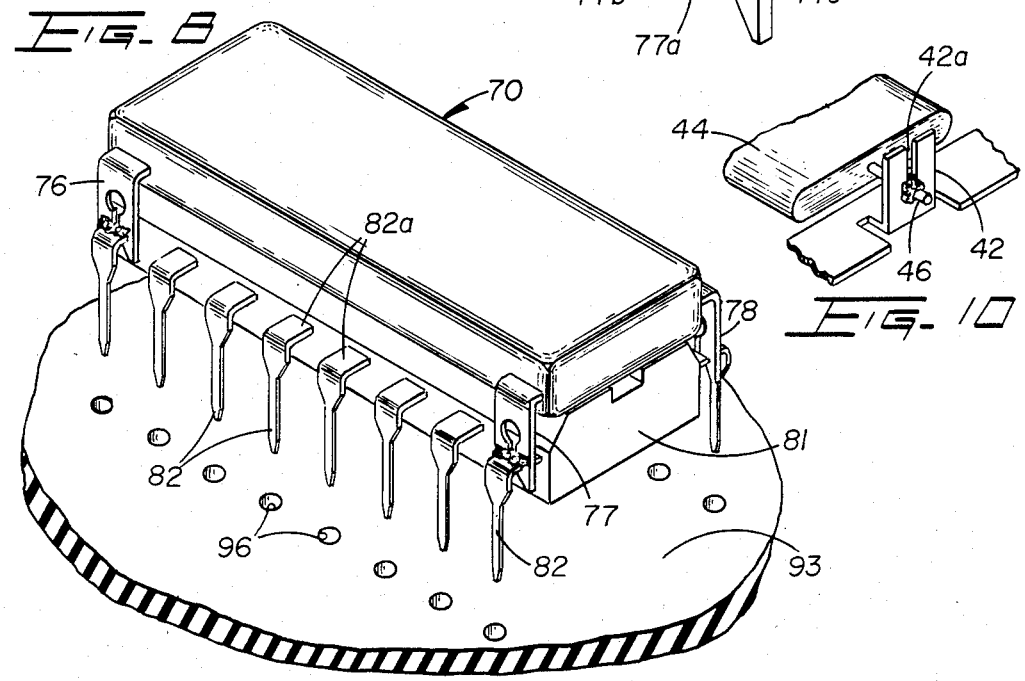

COMPONENT MODULE FOR PIGGYBACK MOUNTING ON A CIRCUIT PACKAGE HAVING DUAL-IN-LINE LEADS

FIELD OF THE INVENTION

This invention relates to integrated circuit assemblages and, more particularly, to a component module, including a decoupling capacitor, adapted to be piggyback mounted on, and electrically interconnected with only selected leads of, an integrated circuit package of the type having dual-in-line leads.

BACKGROUND OF THE INVENTION

In complex microelectronic circuitry, a plurality of integrated circuit packages with dual-in-line leads, generally referred to simply as "DIPs", are normally employed. These circuit packages may incorporate diverse types of integrated digital devices, such as in the form of memories, operational amplifiers, multivibrators, flip-flops, etc.

Regardless of their logic function, these circuit packages, as typically employed in a composite utilization circuit, normally individually require a so-called decoupling capacitor connected between the battery and ground leads thereof. In most DIPs having standard pin-outs ranging from 14-22 leads, the battery and ground leads are respectively chosen to be an end lead in one row and the diagonally disposed end lead in the other row thereof. The capacitors are primarily employed to absorb and, thereby, smooth out the detrimental surges of current, and attendant voltage drops, that would otherwise be applied to the DIPs (because of their inherently resistive input load characteristics) each time they were initially energized. Such decoupling capacitors also function as effective low pass filters to minimize high frequency transient noise that is often generated as a result of the exceedingly high speeds at which most DIPs switch operating state.

The use of discrete, circuit board-mounted decoupling capacitors is normally not desirable, not only because board space is often at a premium, but because of the necessary appreciable lengths of the interconnections between the capacitor and an associated DIP. This can often result in increased values of effective series resistance and inductance that can actually nullify the intended decoupling function of the capacitor. Additionally, decoupling capacitors with conventional leaded electrodes normally present appreciable series resistance to induced current in the form of high frequency transient type noise, thus reducing the effectiveness of such a capacitor as a low pass filter. This follows from the fact that the effective resistance of a conducton carrying a very high frequency current varies inversely with the surface area rather than the mass of the conductor.

One approach taken heretofore to overcome the above-mentioned problems relating to the use of board-mounted decoupling capacitors has been to incorporate the capacitor in a specially constructed socket of the type disclosed in J. A. Lockhart, Jr. U.S. Pat. No. 3,880,493. More specifically, the capacitor is not only embedded in, but the dielectric layers thereof are formed out of the same material used to form, the socket. The lead-out contacts of the capacitor are respectively secured to different connectors which form an integral part of the socket. The connectors are spaced apart and adapted to respectively receive the battery and ground leads of a socket-mounted DIP, while nested within respectively aligned thru-holes of a circuit board.

While a properly constructed capacitor in such an interfacing socket could perform an effective decoupling function, there is no practical way to replace only the capacitor, should it become defective, without having to replace the entire composite socket. This would prove quite costly, as the capacitor itself would normally constitute a very small percentage of the total cost of the socket. This would particularly be the case if precious metal contact areas were plated on the inner surfaces of the socket connectors so as to establish reliable solderless connections therebetween. It is because of this last-mentioned expense, in particular, that sockets, in whatever form, have in many cases not been preferred over the far less costly technique of directly mounting and solder-connecting IC DIPs to a circuit board.

There has thus been a need for a simplified, reliable and inexpensive way to interconnect a decoupling capacitor to the battery and ground leads of either a circuit board or socket-mounted DIP, with minimal effective series resistance and inductance being established by such interconnections, and with no additional board or socket space being required for the capacitor. In addition, in many integrated circuit applications, wherein a large number of relatively high power integrated circuits of the DIP type are employed, there has also been a need for a heat sink that could be incorporated as part of a composite decoupling capacitor-DIP assemblage.

SUMMARY OF THE INVENTION

A component mddule, adapted for piggyback mounting on an IC DIP, is formed with a component, such as a flat rolled film capacitor with metallic end electrodes, encapsulated within a molded housing of preferably parallelepiped configuration. The electrodes are uniquely connected to only two of preferably four rectangularly shaped terminals that project downwardly from different corners of the housing. The two terminals connected to the capacitor electrodes are uniquely diagonally disposed and spaced as to respectively engage, and bias against, the battery and ground leads of a standard pin-out DIP, when the component module is piggyback-mounted thereon. The other two diagonally disposed terminals of the circuit module are electrically isolated from the capacitor, being employed only to facilitate the piggyback mounting of the component module on an associated DIP, and to maintain the latter in the proper position until permanently secured to the supporting DIP through soldered connections.

In one of several preferred component module embodiments, the terminals are dimensioned to overlie and extend coextensively with the respectively mating DIP leads through aligned solder-connecting thru-holes of a circuit board, for example. In a second preferred component module embodiment, the terminals thereof are bifurcated and adapted to be snap-locked on and, thereafter, soldered to, the horizontal shoulder portions of the respectively associated leads of a supporting DIP.

With the preferred component module structured and piggyback-mounted on a DIP as described above, it is seen that the interconnections will add minimal effective series resistance and inductance to the circuit assemblage.

In accordance with a preferred method of fabricating the described component module embodiments, the four terminals thereof are preferably formed out of a lead frame type of strip stock carrier. Such a carrier readily allows the upper portion of the two diagonally disposed terminals that are ultimately solder-connected to the capacitor electrodes to be pre-formed with uniquely configured brackets. They are adapted to both support and make elevational contact with the electrode-defined end portion of the capacitor.

An optional modification of the preferred component module embodiments, and of the methods for their fabrication, relates to a heat sink which may be fabricated out of the same strip stock carrier employed to form the terminals, and may either be partially embedded in, or completely encapsulated by, the molded housing while positioned beneath the capacitor. Such a heat sink may also be employed to function as an effective shield against electromagnetic radiation or interference if made out of, or coated with, a suitable energy-dampening material.

DETAILED DESCRIPTION OF THE DRAWINGS

FIG. 1 is a perspective view, partially in section, of one preferred embodiment of a component module incorporating a decoupling capacitor, and illustrates the manner in which it is encapsulated and terminal-connected, and further illustrates, in phantom, an optional heat sink that may be fabricated as part of the circuit module in accordance with the principles of the present invention;

FIG. 2 is a fragmentary perspective view of a strip stock carrier out of which the fabricated component module terminals of FIG. 1, as well as an optional heat sink, may be formed prior to the capacitor, shown only in phantom, for clarity, being encapsulated within the molded housing, with upper horizontal leg portions of the terminals, and a major central portion of the optional heat sink, being simultaneously embedded therein, in accordance with the principles of the present invention;

FIG. 3, in simplified cross-sectional form illustrated the upper and lower halves of a transfer mold applicable for use in forming the molded housing of the component module of FIG. 1;

FIG. 4 is a perspective view of the component module of FIG. 1 after having been piggyback-mounted on, and interconnected to, an associated integrated circuit of the DIP type, with such composite assemblage being further shown as typically mounted on, and solder-connected to, an associated illustrative printed circuit board;

FIG. 5 is a fragmentary elevational end view, partially in section, taken along the line 5—5 of FIG. 4, showing in greater detail the relationship between one terminal of the component module and an aligned and mating underlying lead of an associated supporting DIP, as assembled and solder-connected to the circuit board of FIG. 4;

FIG. 6 is a perspective view of a second preferred component module embodiment which is distinguished from the embodiment of FIG. 1 by the manner in which the terminals are constructed, and adapted, for interconnection with the horizontal shoulder portions of respectively aligned leads of a DIP;

FIG. 7 is a fragmentary perpsective view illustrating in greater detail the construction of the downwardly extending bifurcated end region of one representative terminal of the component module of FIG. 6;

FIG. 8 is a perspective view of the component module of FIG. 6 after having been piggyback-mounted on, and interconnected to, an associated DIP prior to such a composite assemblage being mounted on, and solder-connected to, an associated illustrative circuit board;

FIG. 9 is a fragmentary elevational end view, partially in section, illustrating in greater detail the solder-connected relationship between one terminal of the component module of FIG. 6, the upper shoulder portion of an aligned lead of an associated supporting DIP, and the supporting circuit board depicted in FIG. 8; and FIG. 10 is a fragmentary perspective view of a modified terminal bracket adapted to receive a leaded end of a component, such as the illustrative capacitor, with the lead preferably being soldered to the bracket prior to the capacitor being encapsulated within a molded housing, as depicted in FIGS. 1 and 6.

DETAILED DESCRIPTION OF THE INVENTION

It should be appreciated that while the invention is described in detail herein primarily in regard to mounting a decoupling capacitor module in a piggyback manner on an integrated circuit having dual-in-line leads (of the DIP type), and simultaneously effecting the desired interconnections therebetween, it should be understood that other types of discrete components or devices, such as resistors, miniaturized relays, fuses, diodes and the like could be similarly encapsulated in a molded component housing and interconnected through the terminals thereof to selected leads of an associated DIP for a specific circuit function.

With particular reference to FIG. 1, there is illustrated one preferred component module embodiment 15 including a flat rolled metallized film capacitor 18 encapsulated within a molded housing 21. Also forming part of the fabricated component module 15 are four downwardly extending terminals 26–29, each being secured to the housing 21 at a different corner region thereof. As best seen in FIG. 2, only the diagonally disposed terminals 27 and 29 are respectively connected to end electrodes 23 and 24 of the capacitor 18.

In the illustrative capacitor 18, as fabricated, the electrodes 23, 24 are solder-coated and formed as end extensions of the body portion of the capacitor. It should be understood, of course, that many other types of capacitors, such as ceramic capacitors, and with or without leads, could also be employed for the capacitive decoupling purpose of primary concern herein. Regardless of type, the capacitor could also have a tubular, rectangular, or essentially oval, as well as flat, cross-section. It is normally desirous, however, that the chosen capacitor have minimal thickness, so that the component module will have a relatively low profile.

With respect to the molded housing 21, it may be formed out of any suitable plastic material, one such material being sold by the Hysol Company under the code number MG8F, for use in a transfer molding process. The latter process is particularly applicable for molding the housing 21, for reasons described hereinbelow in connection with a description of a preferred method of fabricating the composite component module. It should be understood, however, that the molded housing 21 could also be formed by other molding processes, including the potting of the terminal-connected capacitor.

Considering now the construction and positioning of the terminals 26–29 more specifically, they are preferably initially fabricated out of a lead frame type of strip stock carrier 33, illustrated in FIG. 2. As shown therein, in solid line form, the partially blanked out terminal 26 is formed with an upper inwardly and horizontally disposed leg portion 26a that is isolated from a similarly disposed leg portion 29a, of the terminal 29, by a blanked out slot 36. In a similar manner, an upper horizontally disposed leg portion 28a of the terminal 28 is electrically isolated from a mutually disposed horizontal leg portion 27a of the terminal 27 by a blanked out slot 38.

All four terminals are, of course, ultimately severed from the longitudinally disposed strip stock carrier rails (or dam bars) 41 and 42, as indicated by the blank-out lines 41a and 42a shown in dash-line form in FIG. 2. During the final blank out of the terminals 26–29, and in preparation for the encapsulation of the terminal-connected capacitor 18, the outer end regions of the terminals, preferably while still in a common plane, would be clamped by suitable fixturing (not shown) in a well-known manner.

Electrical contact between the capacitor electrodes 23 and 24 and the respective terminals 27 and 29 are established in the first illustrative embodiment by forming each of the latter, while in planar strip carrier form with not only the aforementioned inwardly and horizontally disposed leg portions 27a or 29a, but with respective outwardly extending leg portions 27b or 29b. As shown in phantom line form in FIG. 2, each of the oppositely directed leg portions 27b and 29b are ultimately bent into a substantially C-shaped bracket 27c or 29c, through the use of suitable fixturing (not shown). Such fixturing may be either automated or manually operated, but forms no part of the present invention.

The formed brackets 27c and 29c, in addition to effecting reliable contact with the capacitor electrodes, provide the means for supporting and positioning the capacitor prior to the encapsulation thereof within the molded housing 21. Notwithstanding the resilient, frictional contact established between the brackets and the respective capacitor electrodes, it may be desirable in certain applications to also establish permanent soldered connections therebetween. Such connections are facilitated, for example, by fabricating the capacitor with solder-coated electrodes.

While a single C-shaped bracket 27c or 29c is illustrated as being in contact with each of the capacitor electrodes, it is obvious that two or more laterally spaced brackets could be employed, if desired, for a particular application. It is also understood that a flat capacitor of the type illustrated could be supported by a plurality of tangs, such as three (not shown), wherein the middle tang could be bent at a predetermined angle downwardly, for example, relative to the major plane of the strip carrier depicted in FIG. 2, with the two outer tangs bent at a corresponding, but oppositely inclined, angle upwardly so as to accommodate an electrode end portion of the capacitor within the vertices thereof.

Concomitantly, the C-shaped brackets 27c and 29c illustrated in FIGS. 1 and 2 could also be readily replaced by two upwardly extending ears (not shown) with either flat or arcuate surfaces, so as to nest body end portions of either a leaded or leadless capacitor (or any other component or device) therewithin. With respect to leaded components, an alternative L-shaped bracket 42, of the type depicted in FIG. 10, would normally be desired in addition to any other terminal-formed members adapted only to support body portions of a capacitor (or any other component). With such an L-shaped bracket, having a central lead-receiving slot 42a, a capacitor 44, for example, having axial disposed leads 46 (only one seen in FIG. 10), may be both readily supported by, and solder-connected to, the bracket 42. This type of bracket, of course, by itself is applicable for use in supporting diverse types of leaded components or devices, having various cross-sectional configurations.

In the illustrative embodiment of FIG. 1, the diagonally disposed terminals 26 and 28, as previously noted, are not electrically connected to the capacitor electrodes 23, 24. As such, they are employed only to facilitate the piggyback mounting of the component module 15 on an associated integrated circuit DIP 51, which, in turn, is mounted on a circuit board 54, as depicted in FIG. 4. In this regard, it should be appreciated that the component module 15 could be employed with only the two capacitor-connected leads 27 and 29, particularly if the module was to be mounted on a DIP only after the latter had been mounted on, but not yet solder-connected to, a circuit board. With the component module 15 mounted on the DIP 51, as illustrated in FIG. 4, it is seen that the terminals 26–29 (only three being seen) respectively overlie different ones of only the end leads, commonly identified by the reference numeral 53, of the DIP 51. By way of example only, in FIG. 4 the diagonally disposed terminals 27 and 29 are chosen to be in mating contact with the representative battery and ground leads, respectively, of the DIP 51.

The terminals 26–29 are preferably formed out of a suitable material, such as so-called full hard solder-plated brass, commercially available from a number of sources in various widths and thicknesses, in strip stock form. Such material exhibits not only good conductivity, but resiliency. This insures that the terminals will always reliably bias against the outer surfaces of the respectively aligned leads 53 of an associated DIP, and remain frictionally secured thereto until permanently solder-connected. As such, the component module 15 may be piggyback-mounted on a DIP, either before or after the latter has been mounted on the circuit board 54. At that time, not only the leads of the DIP 51, but the selectively mating terminals 26–29 of the component module 15, extend through the respectively aligned thru-holes 56 of the circuit board, as depicted in FIGS. 4 and 5. Thereafter, reliable permanent soldered connections 57 (only one seen in FIG. 5) may be established between the DIP leads 53, terminals 26–29, and the respectively associated land areas or pads 58 formed on the underside of the circuit board 54. Such soldered connections are preferably effected with a conventional wave soldering machine.

As an optional modification of the one preferred illustrative embodiment of FIG. 1, there is shown in phantom-line form a heat sink 61, the central planar portion 61a of which is positioned beneath the central body portion of the capacitor 18, and also embedded within the molded housing 21 of the module 15. The illustrative heat sink is also formed with two L-shaped exposed portions 61b, 61c so as to provide a greater mass and surface area. Such a heat sink is of particular advantage in large electronic systems where a number of the DIPs employed are of the so-called high power type. Such DIPs inherently generate appreciable amounts of heat, and often require external cooling unless some form of closely spaced heat sinks are provided. The heat sink 61, as previously mentioned, may also function as an effective shield against electromagnetic radiation or interference, if made out of, or coated with, a suitable material for that purpose.

As seen in FIG. 2, the heat sink 61 may be readily fabricated out of the same strip stock carrier 33 employed to form the terminals 26–29. In that event, it is obvious that the carrier guide rails (or dam bars) 41 and 42 would be severed therefrom, in the same manner as described above with respect to the terminals 26–29, prior to the capacitor, horizontal leg portions of the terminals and at least the central portion of the heat sink being encapsulated within the molded housing 21.

In accordance with a method of fabricating the component module 15 of FIG. 1, reference is made to FIG. 3 which, in simplified form, illustrates a two-piece transfer mold 65 for forming the module housing 21. Such a mold is employed after all of the blanking operations, and the bracket forming operations, have been performed on the strip stock carrier 33, but before the terminal and optional heat sink bending operations, as illustrated in FIG. 2.

More specifically, the upper and lower mold sections 66a, 66b are dimensioned such that when properly positioned and closed, the two longitudinally disposed carrier rails 41 and 42 are each clamped between the associated one of the two longitudinally disposed and interfacing mold sections that define a parting line. The inner edges of each of the two laterally disposed and interfacing mold sections that define a parting are preferably located very close to the associated one of the parallel extending outermost edges of the terminal leg portions 26a, 29 a, or 27a, 28a.

The transfer mold material is injected into the mold cavity 67 through a conventional longitudinally disposed runner 68a and a transversely disposed gate 68b in a well known manner, so as to completely encapsulate the capacitor 18, embed the major parts of the horizontal leg portions of the terminals 26–29, and at least the central portion 61a of the optional heat sink 61, if employed. For the molding operation described, the gate would preferably have a thickness defined by the width of the strip stock carrier 33.

After the molding operation, any thin webs of plastic (flash) that are typically formed along various parting line-defined sections of the molded housing (in the plane of the unbent terminals), are easily removed, preferably by a conventional grit blasting operation. It is also apparent, of course, that the terminals 26–29, and the end portions 61b, 61c of the optional heat sink, if employed, may be bent into their final configurations, as illustrated in FIG. 1, at any time after the molding operation.

While only one transfer injection runner and gate have been illustrated in FIG. 3, in an automated system it may be advantageous to inject the molding material into the mold cavity from opposite sides thereof. It is also understood, of course, that a suitable vent (not shown) is normally employed in molds of the transfer type.

While a lead frame type of strip stock carrier 33, and a transfer mold 65, have been described for use in fabricating the component module 15, the terminals could be individually blanked out of strip stock and formed, and then, as previously mentioned, a potting process could be employed, if desired, to produce the molded encapsulating housing 21. If the latter was formed by a potting operation, it is appreciated that the open mold cavity would require suitable terminal support slots, or other support means, therewithin to position the terminals 26–29 until the potting material solidified to form the housing 21.

FIGS. 6–9 illustrate another preferred embodiment of the invention wherein a component module 70 includes a molded housing 72 within which, for purposes of illustration, is encapsulated a capacitor 74, shown only in phantom line form. Also supported by the housing are four uniquely configured terminals 76–79. The capacitor 74 may be identical to the capacitor 18 illustrated in the first embodiment of FIG. 1 and, as such, while not shown, may be supported and terminal-connected in the same manner.

Considering the terminals 76–79 now more specifically, they are each formed, preferably while an integral part of a strip stock carrier, with a DIP lead-receiving end region that is bifurcated. With particular reference to only representative terminal 77, as best seen in FIG. 7, such an end region is formed in part by a necked-down opening 77a that tapers inwardly a predetermined distance until it communicates with a laterally disposed DIP lead-receiving slot 77b.

A key-hole configured slot 77c also communicates with the lateral slot 77b on the side thereof opposite the necked-down opening 77a. The key-hole slot results in two peculiarly formed bifurcated leg sections 77d and 77e that exhibit appreciable resiliency. Thus, when the component module 70 is mounted on a DIP 81, as depicted in FIGS. 8 and 9, an upper horizontal, rectangularly shaped shoulder portion 82a of an aligned lead 82 is easily urged, with minimal force, into and, thereafter, snap-lock confined within the lateral terminal slot 77b.

The terminal 77, for purpose of illustration, represents one of the two terminals, the other being 79, connected to different end electrodes (not seen) of the capacitor 74. As such, the respective DIP leads 82 that underlie the terminals 77 and 79 illustratively represent the battery and ground leads of the latter, for the reasons more fully described above with respect to the first component module embodiment of FIG. 1.

It is readily apparent, of course, that the degree of resiliency of the bifurcated terminal leg sections, such as 77d and 77e of representative terminal 77, is determined not only by the size and shape of the necked down opening 77a, and the size and shape of the communicating key-hole slot 77c, relative to the nominal width dimension of the terminal, but by the type of material out of which the terminal is made. One preferred commercially available material, as previously mentioned, is known as full hard solder plated brass.

In accordance with another aspect of the component module embodiment of FIGS. 6–9, each of the terminals is also preferably fabricated with two pre-formed solder beads 76f–79f and 76g–79g (77f and 77g being best seen in FIG. 7). These solder beads are preferably positioned on opposite sides of the longitudinal section of each key-hole slot, such as 77c, and extend along different ones of the upper edges of the lead-receiving lateral slot, such as 77b. While these solder beads are not essential in effecting reliable soldered connnections between the DIP leads and component module terminals, they are advantageously easily positioned on the terminals by initially comprising a part of the strip stock employed to form the blanked out terminals. Such strip stock, for use as lead frame type carriers, is also commercially available from a number of different suppliers.

As best seen in FIG. 9, the solder beads on each terminal, such as on terminal 77, when re-flow soldered, establish well-defined solder fillets 91 between each terminal and the upper shoulder portion 82a of the DIP lead 82 interlocked therewith.

These solder connections may be effected either before or after the DIP 81, with a component module 70 piggyback-mounted thereon, is positioned, as a circuit assemblage, on an associated substrate, such as a circuit board 93 depicted in FIGS. 8 and 9. Securement of such an assemblage to the circuit board is effected by inserting only the leads 82 of the DIP 81 through the respectively aligned thru-holes 96 formed in the board and, thereafter, soldering the leads to respeceive underside land areas or pads 97 (seen only in FIG. 9). Such solder connections, as indicated by the solder fillet 98, may be readily effected in an automated manner as previously noted, through the use of a conventional wave soldering machine.

It should be appreciated that while pre-formed solder beads have been shown as part of all four terminals 76–79 in the second illustrative embodiment, only the two chosen diagonally disposed terminals, such as 77 and 79, that are to be respectively connected to the battery and ground leads 82 of the DIP 81, need be soldered to the mating DIP leads. This follows from the fact that the two isolated leads, such as 76 and 78 in the illustrative example, are only employed, as in the case with the first embodiment, to facilitate the piggyback mounting of the component module 70 on the top of the DIP 81. Indeed, in many circuit applications, the component module 70 may readily be employed with only the two capacitor-connected terminals, such as 77 and 79, because of the manner in which they are adapted to snap-lock on the battery and ground leads of a DIP. Should the component module 70 (as well as 15) be employed for other than a ecoupling function, or incorporate a component other than a capacitor, it is obvious that the terminals thereof could be readily spaced so as to make selective contact with any desired ones of the leads of a DIP.

It is also readily apparent, of course, that since the component module terminals 77, 79 are secured to only the upper shoulder portions of the respectively aligned leads 82 of a DIP 81, the latter may be of the type adapted for mounting on either a circuit board or an intermediate socket. Regardless of how the DIPs are mounted, in many applications it may also be desirable to stamp or otherwise imprint descriptive information on the top of the housings of the fabricated component modules embodied herein so as to identify the type or code of the particular DIPs on which they will be subsequently mounted.

While two preferred component module embodiments, each incorporating a uniquely mounted and terminal-connected decoupling capacitor, and which embodiments further embrace the utilization of an optional heat sink, have been disclosed herein, as well as methods for their fabrication, it is obvious that various modifications may be made to the present illustrative claimed embodiments and methods of the invention, and that a number of alternative related embodiments and methods could be devised by one skilled in the art without departing from the spirit and scope of the invention.

What is claimed is:

1. A component module comprising:
    a molded housing having a base with four corners;
    a component encapsulated within said housing and having first and second electrodes;
    a first terminal including an upper portion having a pre-formed integral bracket means frictionally engaging at least a portion of said first component electrode, and at least partially embedded in said housing, and a lower portion that projects downwardly from a region adjacent one predetermined base-defined corner of said housing in close proximity to said first component electrode; and
    a second terminal including an upper portion having a pre-formed integral bracket means for frictionally engaging at least a portion of said second component electrode, and at least partially embedded in said housing, and a lower portion that projects downwardly from a region adjacent the base-defined corner of said housing that is diagonally disposed from said one predetermined first terminal corner thereof, the lower portion of said first and second terminals being spaced so as to respectively contact selected correspondingly disposed leads of an associated integrated circuit package, having dual-in-line leads, when said component module is subsequently piggyback-mounted thereon.

2. A component module in accordance with claim 1 wherein said component comprises a capacitor, with said first and second electrodes being respectively accessible from first and second ends thereof.

3. A component module in accordance with claim 1 wherein said downwardly extending lower portions of said first and second terminals are each dimensioned so as to terminate coextensively with an underlying lead of a circuit package when the latter, together with said component module piggyback-mounted thereon, is connected to an associated circuit substrate.

4. A component module in accordance with claim 1 wherein the lower portion of each of said first and second terminals is formed with a resilient, bifurcated end region, said end region defining two laterally spaced and resilient leg sections that are configured to form a necked-down opening therebetween which communicates with a laterally disposed slot that is also formed by said leg sections, said slot being wider than the narrowest inner width of said opening immediately adjacent thereto, and also being dimensioned so as to allow a shoulder portion of a rectangularly shaped circuit package lead to be readily snapped therein after having been forced through said communicating opening.

5. A component module in accordance with claim 4 wherein at least one pre-formed solder bead is mounted adjacent the slot in each of said bifurcated terminals for soldering the ends of said bifurcated terminals to respective associated leads of a circuit package when brought into interlocked engagement therewith.

6. A component module in accordance with claim 1 further including a heat sink having a central planar portion positioned beneath said component, and embedded in said housing; and outer exposed portions located outside of, and projecting from, said housing.

7. A component module in accordance with claim 1 further comprising third and fourth terminals, electrically isolated from said first and second component electrodes, and each having an upper end portion at least partially embedded in said housing, and a lower end portion that projects downwardly from a region adjacent a different one of the base-defined corners of said housing not associated with said first and second terminals, the lower portions of said third and fourth terminals being spaced so as to respectively engage different leads of a circuit package when said component module is mounted thereon and, thereby, facilitate the positioning of said component module on said circuit package.

8. A component module comprising:
a mold housing having a rectangularly shaped base;
a capacitor encapsulated within said housing and having first and second opposite end electrodes;
a first terminal including an upper leg portion in contact with said first capacitor electrode, and at least partially embedded in said housing, and a lower leg portion that projects downwardly from a region adjacent a first base-defined corner of said housing in close proximity to said first capacitor electrode;
a second terminal projecting downwardly from a region adjacent a second base-defined corner of said housing in close proximity to said first capacitor electrode, and having an upper end region embedded in said housing, but electrically isolated from both said first and second capacitor electrodes;
a third terminal including an upper leg portion in contact with said second capacitor electrode, and at least partially embedded in said housing, and a lower leg portion that projects downwardly from a region adjacent a third base-defined corner of said housing, in close proximity to said second electrode said third corner being diagonally disposed relative to said first corner; and
a fourth terminal projecting downwardly from a region adjacent a fourth base-defined corner of said housing in close proximity to said second capacitor electrode, and having an upper end region embedded in said housing, but electrically isolated from both said first and second capacitor electrodes, and wherein the lower leg portions of said first and third terminals are spaced to correspond to diagonally disposed end leads of a circuit package for piggyback-mounting the component module thereon.

9. A component module in accordance with claim 8 wherein said capacitor is of thin, rectangular configuration, and wherein said upper leg portion of each of said first and third terminals includes pre-formed integral bracket means frictionally engaging at least a portion of the associated one of said first and second capacitor electrodes.

10. A component module in accordance with claim 8 wherein said downwardly extending leg portions of at least said first and third terminals are each dimensioned so as to terminate coextensively with an underlying lead of a circuit package when the latter, together with said component module piggyback-mounted thereon, is connected to an associated circuit substrate.

11. A component module in accordance with claim 8 wherein the lower leg portion of each of said terminals is formed with a resilient, bifurcated end region, said end region defining two laterally spaced and resilient leg sections that are configured to form a necked-down opening therebetween which communicates with a laterally disposed slot that is also formed by said leg sections, said slot being wider than the narrowest inner width of said opening immediately adjacent thereto, said slot also being dimensioned and located so as to allow a shoulder portion of a rectangularly shaped circuit package lead to be forced through said necked-down opening until snapped into said slot.

12. A component module in accordance with claim 11 wherein at least one pre-formed solder bead is mounted adjacent the slot in each of said bifurcated component module terminals, as fabricated, so as to facilitate reflow-type soldered connections being established between the ends of said bifurcated terminals and respectively associated leads of a circuit package when brought into interlocked engagement therewith.

13. A component module in accordance with claim 9 wherein at least the upper leg portions of said first and third terminals are inwardly disposed and at least substantially horizontally oriented relative to the base of said housing, and wherein said bracket means is of substantially C-shaped configuration.

14. A component module in accordance with claim 13 wherein the upper end regions of said second and fourth terminals define upper leg portions that are inwardly disposed and at least substantially horizontally oriented relative to the base of said housing.

15. A component module in accordance with claim 8 wherein said capacitor electrodes are of the leaded type, and wherein said upper leg portions of each of said first and third terminals includes pre-formed integral bracket means adapted to receive the associated one of said first and second capacitor leads.

16. A component module in accordance with claim 8 wherein the downwardly extending sections of said second and fourth terminals define lower leg portions, and wherein the lower leg portion of each of said four terminals is formed with a resilient, bifurcated end region, said end region defining two laterally spaced and resilient leg sections that are configured to form a necked-down opening therebetween which communicates with a laterally disposed slot that is also formed by said leg sections, said slot being wider than the narrowest inner width of said opening immediately adjacent thereto, said slot also being dimensioned and located so as to allow a shoulder portion of a rectangularly shaped circuit package lead to be forced through said necked-down opening until snapped into said slot, each of said terminals further including a substantially longitudinally disposed slot that communicates with, and is positioned on the side of said lateral slot opposite the necked-down opening, so as to increase the resiliency of the bifurcated leg sections of each terminal.

17. A component module in accordance with claim 14 further including a heat sink having at least a major planar central portion positioned beneath said capacitor, and embedded in said housing.

18. A composite circuit assemblage, comprising: an integrated circuit package having dual-in-line leads, each lead having an outer horizontal shoulder portion and a downwardly extending leg portion, and wherein two diagonally disposed end leads of said circuit package comprises the battery and ground leads thereof, respectively; and
a component module mounted on, and interconnected with the battery and ground leads of, said integrated circuit package, said component module including:
a molded housing having a rectangularly shaped base;
a decoupling capacitor encapsulated within said housing and having first and second electrodes;
a first terminal including an upper portion in contact with said first capacitor electrode, and at least partially embedded in said housing, and a lower portion that projects downwardly from a region adjacent one predetermined base-defined corner of said housing in close proximity to said first capacitor electrode; and a second terminal including an upper portion in contact with said second capacitor electrode, and at least partially embedded in said housing, and a lower portion that projects downwardly from a region adjacent the base-defined corner of said housing that is diagonally disposed from said one predetermined first terminal corner thereof, and wherein the lower end portion of each of said first and second terminals are formed with a resilient, bifurcated end region, said end region defining two laterally spaced and resilient leg sections that are configured to form a necked-down opening therebetween which communicates with a laterally disposed slot that is also formed by said leg sections, said slot being wider than the narrowest inner width of said opening immediately adjacent thereto, said slot also being dimensioned and located so as to receive and snap-lock confine a shoulder portion of the respectively aligned one of the circuit package battery and ground leads therewithin.

19. A composite circuit assemblage in accordance with claim 18 wherein a soldered connection is formed between the snap-locked horizontal shoulder portion of each of said circuit package battery and ground leads and the respectively interlocked one of said first and second terminals.

20. A composite circuit assemblage in accordance with claim 18 wherein said component module further includes a heat sink having at least a major planar central portion that is positioned beneath said capacitor, and embedded in said housing.

21. A composite circuit assemblage in accordance with claim 18 wherein said component module further includes third and fourth terminals, each having an upper end portion at least partially embedded in said housing, and a lower bifurcated portion that projects downwardly from a region adjacent a different one of of the base-defined corners of said housing not associated with said first and second terminals, the lower portions of said third and fourth terminals each being adapted to snap-lock confine within a laterally disposed slot formed therein a different horizontal shoulder portion of an aligned one of said circuit package leads.

* * * * *

UNITED STATES PATENT AND TRADEMARK OFFICE
CERTIFICATE OF CORRECTION

PATENT NO. : 4,521,828

DATED : June 4, 1985

INVENTOR(S) : W. J. Fanning

It is certified that error appears in the above—identified patent and that said Letters Patent is hereby corrected as shown below:

Column 1, line 53, "conducton" should read --conductor--.

Column 2, line 36, "mddule" should read --module--.

Column 9, line 36, "ecoupling" should read --decoupling--.

Signed and Sealed this

Seventeenth Day of September 1985

[SEAL]

Attest:

DONALD J. QUIGG

Attesting Officer

Commissioner of Patents and Trademarks—Designate